United States Patent
Bekele et al.

(10) Patent No.: US 9,994,951 B2
(45) Date of Patent: Jun. 12, 2018

(54) PHOTOVOLTAIC SPUTTERING TARGETS FABRICATED FROM RECLAIMED MATERIALS

(71) Applicants: Robel Y. Bekele, Washington, DC (US); Jason D. Myers, Alexandria, VA (US); Jesse A. Frantz, Washington, DC (US); Vinh Q. Nguyen, Fairfax, VA (US); Jasbinder S. Sanghera, Ashburn, VA (US); Sunlight Photonics Inc., Edison, NJ (US)

(72) Inventors: Robel Y. Bekele, Washington, DC (US); Jason D. Myers, Alexandria, VA (US); Jesse A. Frantz, Landover, MD (US); Vinh Q. Nguyen, Fairfax, VA (US); Jasbinder S. Sanghera, Ashburn, VA (US); Allan J. Bruce, Scotch Plains, NJ (US); Michael Cyrus, Summit, NJ (US); Sergey V. Frolov, Murray Hill, NJ (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 872 days.

(21) Appl. No.: 14/211,354

(22) Filed: Mar. 14, 2014

(65) Prior Publication Data
US 2014/0264988 A1    Sep. 18, 2014

Related U.S. Application Data

(60) Provisional application No. 61/787,585, filed on Mar. 15, 2013.

(51) Int. Cl.
 B29C 73/00    (2006.01)
 C23C 14/34    (2006.01)
 C23C 14/06    (2006.01)

(52) U.S. Cl.
 CPC ...... *C23C 14/3414* (2013.01); *C23C 14/0623* (2013.01)

(58) Field of Classification Search
 CPC ................... C23C 14/3414; H01L 31/18
 (Continued)

(56) References Cited

U.S. PATENT DOCUMENTS 6,294,724 B1 *  9/2001  Sasaoka ............... H01L 31/048
                                                      136/244
8,342,229 B1 *  1/2013  Ziani .................... B22D 17/08
                                                      164/113

(Continued)

FOREIGN PATENT DOCUMENTS

WO    WO2012042959 A1 *   4/2012   ............ C23C 14/06
WO       2013089630 A1     6/2013

OTHER PUBLICATIONS

Photovoltaics Based on Semiconductor Powders: Materials and Process for Energy: communicating current research and technical development (A Mendez-Vilas, Ed), Dieter Meissner, (2013).*

(Continued)

*Primary Examiner* — Nahida Sultana
(74) *Attorney, Agent, or Firm* — US Naval Research Laboratory; Joseph T. Grunkemeyer

(57) ABSTRACT

A method of: providing one or more spent sputtering targets comprising a photovoltaic compound and grinding the photovoltaic compound in an inert environment to form a powder.

22 Claims, 3 Drawing Sheets

(58) Field of Classification Search
USPC .............. 264/36.18; 257/233, 292, 431–466; 438/48, 54, 57, 63, 64, 73; 136/251, 244, 136/256, 259
See application file for complete search history.

(56) References Cited

U.S. PATENT DOCUMENTS

| | | | | |
|---|---|---|---|---|
| 8,709,548 | B1* | 4/2014 | Newbery | C23C 14/3414 106/1.18 |
| 8,728,200 | B1* | 5/2014 | Weiting | C01B 19/002 422/285 |
| 9,331,221 | B2* | 5/2016 | Chen | H01L 31/0322 |
| 9,781,985 | B2* | 10/2017 | Akin | A45B 25/02 |
| 2005/0247386 | A1* | 11/2005 | Matera | C22C 5/02 148/668 |
| 2006/0275191 | A1* | 12/2006 | Fthenakis | C01G 11/00 423/100 |
| 2007/0079864 | A1* | 4/2007 | Gronet | H01L 31/02008 136/244 |
| 2007/0290211 | A1 | 12/2007 | Nakayama et al. | |
| 2008/0053515 | A1* | 3/2008 | Paull | H01L 31/0543 136/248 |
| 2009/0250722 | A1* | 10/2009 | Bruce | H01L 31/0322 257/184 |
| 2009/0305449 | A1* | 12/2009 | Bollman | B32B 15/01 438/57 |
| 2010/0170786 | A1* | 7/2010 | Wang | B22F 3/12 204/298.13 |
| 2010/0226839 | A1* | 9/2010 | Lian | C22B 3/22 423/112 |
| 2010/0329970 | A1* | 12/2010 | Lian | C01G 3/00 423/510 |
| 2012/0012153 | A1* | 1/2012 | Azechi | H01B 1/22 136/244 |
| 2012/0145234 | A1* | 6/2012 | Roy-Mayhew | H01G 9/2022 136/256 |
| 2013/0168241 | A1* | 7/2013 | Tamura | C23C 14/0623 204/298.13 |
| 2014/0341799 | A1* | 11/2014 | Foreman | B09B 3/00 423/509 |
| 2015/0287850 | A1* | 10/2015 | Tai | H01L 31/022425 136/256 |
| 2015/0372171 | A1* | 12/2015 | Wang | H01L 31/022441 136/256 |
| 2017/0271134 | A1* | 9/2017 | Endo | H01J 37/3426 |
| 2018/0044778 | A1* | 2/2018 | Bailey | C23C 14/3407 |

OTHER PUBLICATIONS

Miyazaki, "Recycling of CIGS absorber layer for deposition of CIGS film" Phys. Status Solidi C 10, No. 7-8, 1031-1034 (2013).
Bekele et al., "CIGS Sputtering Targets Fabricated From Reclaimed Materials" PVSC 39 (Jun. 2013).

* cited by examiner

PHOTOVOLTAIC SPUTTERING TARGETS FABRICATED FROM RECLAIMED MATERIALS

This application claims the benefit of U.S. Provisional Application No. 61/787,585, filed on 15 Mar. 2013. The provisional application is incorporated herein by reference.

TECHNICAL FIELD

The present disclosure is generally related to methods and systems for recycling quaternary photovoltaic sputtering target material.

DESCRIPTION OF RELATED ART

Within the field of photovoltaics, Copper Indium Gallium Diselenide (Cu(In,Ga)Se$_2$) (CIGS), for example, has become one of the top competitors in thin films with current record efficiency of roughly 20% (Repins et al., "19.9%-Efficient ZnO/CdS/CuInGaSe$_2$ solar cell with 81.2% fill factor" *Prog. Photovolt.: Res. Appl.*, 16, 235-239 (2008) (Repins); Jackson et al., "New world record efficiency for Cu(In,Ga)Se$_2$ thin-film solar cells beyond 20%" *Prog. Photovolt.: Res. Appl.*, 19, 894-897 (2011)).

CIGS and other photovoltaic materials can potentially play a significant role in the solar marketplace. A drawback for CIGS photovoltaic (PV) devices has been that, to date, devices with record efficiencies have been fabricated by a three-stage co-evaporation process (Repins). Although this method is well understood, scaling is difficult. In response to this, other fabrication methods have been developed. Using quaternary CIGS targets to directly sputter the entire film could be a promising method of device fabrication. (Shi et al., "Fabrication of Cu(In,Ga)Se$_2$ thin films by sputtering from a single quaternary chalcogenide target" *Prog. Photovolt.: Res. Appl.*, 19, 160-164 (2011); Chen et al., A straightforward method to prepare chalcopyrite CIGS films by one-step sputtering process without extra Se supply", 37*th IEEE Photovoltaic Specialist Conference*, 2011, 2687-2690; Frantz et al., "Characterization of Cu(In,Ga)Se$_2$ thin films and devices sputtered from a single target without additional selenization", 37*th IEEE Photovoltaic Specialist Conference*, 2011, 364-367; Frantz et al., "Cu(In,Ga)Se$_2$ thin films and devices sputtered from a single target without additional selenization", *Thin Solid Films*, 519, 7763-7765 (2011) (Frantz-2)). This method satisfies many of the requirements for a successful industrial process; it could achieve large area films, deposit them quickly, and create a simple one-step process for depositing films. Using this method, devices have been made with efficiencies in excess of 10% (Frantz et al., "Structural and Electronic Characteristics of Cu(In, Ga)Se$_2$ Thin Films Sputtered From Quaternary Targets", 38*th IEEE PVSC* (2012)). Unfortunately this method does not address another of sputtering's problems: wasted target material.

Referring now to FIG. 1, magnetron sputtering leaves a characteristic "racetrack" wear pattern in the targets as material is sputtered. Used target 13 on the right is showing the copper backing plate 15 not shown on new target 11. Used target 13 cannot be reused in this condition. Electrons are confined to the region of the target where there is a magnetic field; this means that material is removed preferentially where the magnets are located behind the target. Because of this, eventually the target backing materials will be exposed in some areas while other areas will be virtually untouched.

At the point where one area of the target is completely exhausted the target must be discarded because further use would sputter the backing material and yield compositions that are no longer controlled. This leads to a significant amount of material being wasted in the discarded "spent" target. During deposition roughly 25-40% of the target is used before exposing the backing plate leaving up to 75% as wasted material. Wasting this amount of material can negate many of the economic advantages that are gained by using the quaternary sputtering targets. As a 3" diameter commercial-sourced CIGS target costs ~$1600, the loss can be on the order of $1000 per target. What is needed is a method to reclaim material from the spent target and fabricate a new target without compromising the quality of subsequent films made from the new target.

BRIEF SUMMARY

Disclosed herein is a method comprising providing one or more spent sputtering targets comprising a photovoltaic compound; and grinding the photovoltaic compound in an inert environment to form a powder.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

Figure 1:
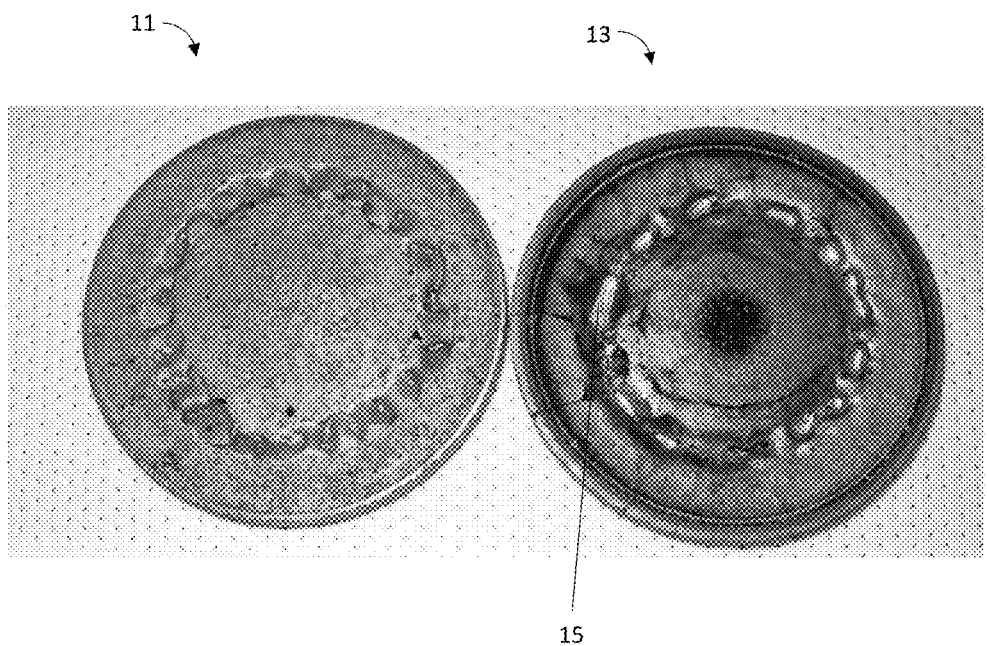
FIG. 1 shows a photographic example of wear pattern on spent CIGS target. The target on the right has been sputtered through entirely and is showing the copper backing plate.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

The system and method of the present embodiment for fabricating new targets from reclaimed material can include, but is not limited to including, obtaining spent quaternary photovoltaic targets used for sputtering thin films, washing the targets with deionized water, drying the targets, grinding the targets in an inert environment, and creating new targets from the ground targets supplemented by new material where needed. The photovoltaic targets can be composed of, for example, but not limited to, to CIGS (Cu(In,Ga)Se$_2$), CZTS (Cu$_2$ZnSnSe$_4$), CGS (CuGaSe$_2$), and CIS (CuInSe$_2$). If the photovoltaic targets have an indium layer, the method can optionally include placing the targets on hot plates to melt the indium layer. If the photovoltaic targets have backing material, the method can optionally include removing the targets from the backing material. If there is residue indium on the targets after the indium layer and the backing material are removed, the method can optionally include removing any remaining indium from the targets using hydrochloric acid. Before combining the ground targets with new material, the method can optionally include weighing the ground targets.

Utilizing material that would have otherwise become waste thereby reduces waste footprint. There is cost savings from saving recycling materials rather than purchasing new materials. For in house made targets the materials cost saving could be 30%-45%. The previous two stated advantages are particularly important as indium is recognized as a scarce resource. If future CIGS targets are made in this manner the amount of bulk CIGS material required would be reduced by 30%-45% per target, meaning that the cost of processing would be reduced. If commercially produced targets are used, the combined waste material from two or three targets (depending on usage) would be enough to produce a new target, reducing cost by 25%-33%. The dissolved indium bonding layer can be reprocessed to further recover raw material. In the following embodiment, after quaternary CIGS targets are used for sputtering thin films and considered spent they are removed from their sputtering guns. The CIGS is indium bonded to a backing plate so after removal from the gun the target is placed on a hot plate to melt the indium layer so the CIGS can be removed from its backing. After the backing plate has been removed there is still a significant amount of indium on the back side of the CIGS target left over from bonding. To remove the remaining indium the target is placed in a hydrochloric acid (HCl) bath. While HCl does dissolve indium, it does not affect the CIGS (Rockett et al., "Near-surface defect distributions in Cu(In,Ga)Se$_2$", Thin Solid Films, 431-432, 301-306 (2003)). After washing thoroughly with DI water the target is dried. The dried CIGS material is then combined with material from other similarly processed spent targets and ground in an inert environment. After weighing the resulting powder, stoichiometric bulk CIGS material is added to make up the difference between the amount obtained from reclaimed targets and the amount necessary to form a new target. Using the method of the present embodiment, roughly 120 g of powder is needed to press a new target. Once machined and prepared for installation the targets contain about 70 g of CIGS material. Each spent target produces between 40 g and 55 g of CIGS waste material so the total of 120 g can be produced by combining waste material from multiple targets or adding 65-80 g of bulk CIGS. The resulting powder is pressed and processed in the same manner as the original targets (Frantz-2). Devices fabricated from the targets made by this method have similar efficiencies as those made from the original targets and similar electrical properties.

Figure 3:
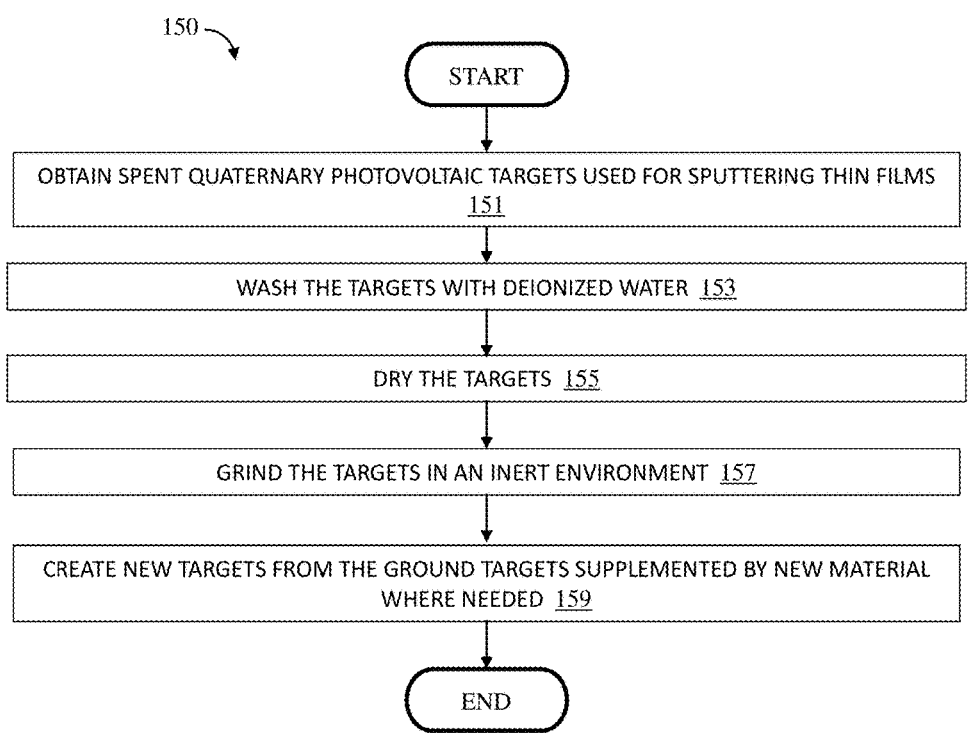
FIG. 3 is a flowchart of the method of the present embodiment.

Referring now to FIG. 3, method 150 for fabricating new targets from reclaimed material can include, but is not limited to including, obtaining 151 spent quaternary photovoltaic targets used for sputtering thin films, washing 153 the targets with deionized water, drying 155 the targets, grinding the targets 157 in an inert environment, and creating 159 new targets from the ground targets supplemented by new material where needed.

The powder generated by grinding the old targets could be remelted to form bulk CIGS for other uses. Individual elements can be added to the powder rather than bulk CIGS in order to correct any deficiencies found. After assessing the composition of the powder, individual elements could be added all of which could be melted to form a target or processed to become a target. The requirement of 120 g of powder can be reduced by refining the pressing process, further enhancing cost savings. This reclamation process is not limited to CIGS, but could be used for other photovoltaic compounds such as CZTS (Cu$_2$ZnSnSe$_4$), CGS (CuGaSe$_2$), CIS (CuInSe$_2$), etc. The method could be applied without the HCl etching step, and in this case, the amounts of the other constituent elements added to the reclaimed material can be adjusted accordingly. The method could be applied to unbonded targets, and in this case there is no need to etch the targets in HCl to remove excess indium. The method could be applied to targets bonded in a method other than indium bonding, and in this case the bonding material could be removed mechanically or with an appropriate etchant.

The following example is given to illustrate specific applications. These specific examples are not intended to limit the scope of the disclosure in this application.

Example

The original targets were made from stoichiometric bulk CIGS by heating high-purity precursors materials (>99.999%) in vacuum-sealed quartz ampoule. The bulk material was then ground into powder in an inert environment (<0.1 ppm O$_2$, <0.1 ppm H$_2$O) and hot pressed into a 3 inch diameter disc. Those discs were then machined to the required dimensions and indium bonded to copper backing plates.

Once a target was completed it was placed in a water cooled magnetron sputtering gun where it was sputtered from to make devices until it was determined that too much material had been removed from the racetrack region to proceed without removing the indium bonding layer or copper backing plate.

After removal from the gun the target was placed on a hot plate to melt the indium layer so the CIGS could be removed from its backing. After the backing plate had been removed there was still a significant amount of indium on the back side of the CIGS target left over from bonding.

To remove the remaining indium the target was placed in an HCl bath. HCl, while stripping indium, does not affect the CIGS (Rockett et al., "Near-surface defect distributions in Cu(In,Ga)Se$_2$", Thin Solid Films, 431-432, 301-306 (2003)). After washing thoroughly with DI water the target was dried. The dried CIGS material was then combined with material from other similarly processed spent targets and ground in an inert environment. After weighing the resulting powder, stoichiometric bulk CIGS material was added to make up the difference between the amount obtained from reclaimed targets and the amount necessary to form a new target. The resulting power was pressed and processed in the same manner as the original target.

During the initial runs using the original targets films were obtained that produced cell with efficiencies of around 10% (Frantz et al., "Structural and Electronic Characteristics of Cu(In,Ga)Se$_2$ Thin Films Sputtered From Quaternary Targets", 38th IEEE PVSC (2012)). After grinding the leftover material from those targets, the composition of the powder was examined by using energy dispersive x-ray spectroscopy (EDS). It was found that although the composition did not match the initial composition (i.e. the original bulk CIGS's composition) exactly it was within reasonable range of what the initial target had been.

TABLE 1

| Normalized target compositions (in weight percentage) | | | | | | |
|---|---|---|---|---|---|---|
| target | Cu | In | Ga | Se | Cu/(Ga + In) | Ga/(Ga + In) |
| originals | 1 | 0.7 | 0.34 | 2.0575 | 0.96 | 0.33 |
| reclaimed | 1 | 0.75 | 0.33 | 1.90 | 0.93 | 0.31 |

Further, EDS showed the composition of the sputtered film obtained from the reformed target yielded films similar in composition to those deposited from the original target.

TABLE 2

| | Film compositions (in atomic percentage) | | | | | |
|---|---|---|---|---|---|---|
| target | Cu | In | Ga | Se | Cu/(Ga + In) | Ga/(Ga + In) |
| original 1 | 33.10 | 14.99 | 7.79 | 44.12 | 1.45 | 0.34 |
| original 2 | 34.83 | 13.78 | 7.88 | 43.51 | 1.61 | 0.36 |
| reclaimed | 34.88 | 15.23 | 7.08 | 42.81 | 1.56 | 0.32 |

Figure 2:
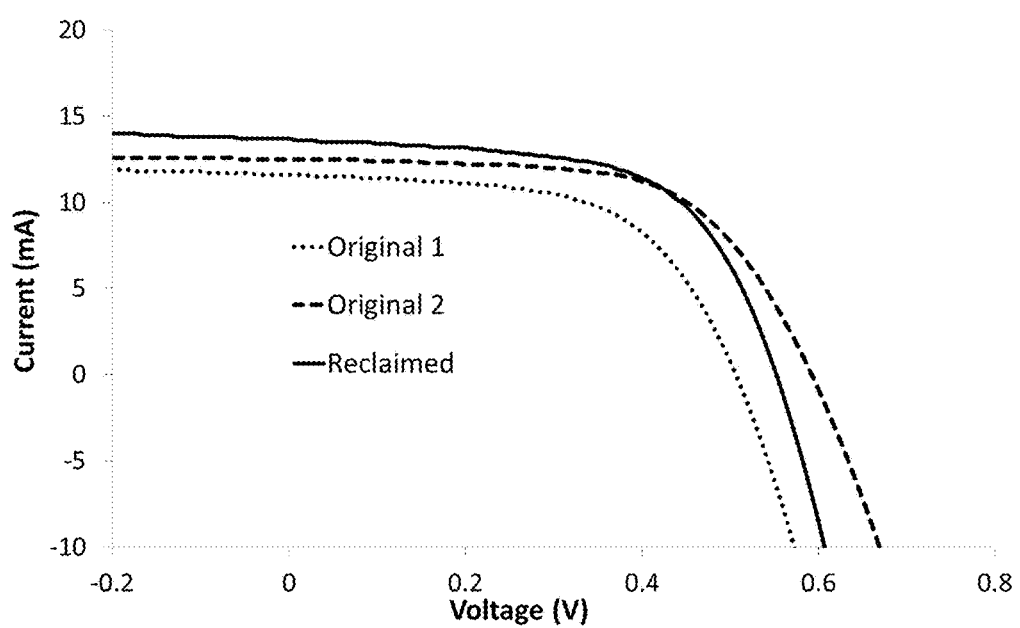
FIG. 2 is a graphical representation of characteristics of the original target and the new target made from reclaimed materials.

Targets created by the same process as the original targets were placed in the same chamber as the reclaimed target and devices were made from both. All steps except the CIGS deposition were carried out in parallel. Examining the IV curves (FIG. 2) and data (Table 3) it is seen that similar efficiencies are obtained for both devices.

TABLE 3

| Data from device made from different targets | | | | |
|---|---|---|---|---|
| target used | Voc (mV) | Jsc (mA/cm$^2$) | fill factor (%) | efficiency (%) |
| original 1 | 506 ± 2 | 23.2 ± 0.7 | 58.6 ± 0.7 | 6.8 ± 0.2 |
| original 2 | 592 ± 4 | 25 ± 2 | 61 ± 2 | 9.1 ± 0.6 |
| reclaimed | 552 ± 2 | 27 ± 2 | 60 ± 1 | 9.1 ± 0.5 |

These results suggest that the problem of wasted materials in CIGS quaternary sputtering can be overcome with simple reprocessing of waste material from spent targets.

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. A method comprising:
    providing a sputtering target assembly comprising:
        a photovoltaic sputtering target comprising a photovoltaic compound;
        a backing plate;
        an indium layer bonding the photovoltaic sputtering target to the backing plate;
    removing the photovoltaic sputtering target from the backing plate by melting the indium; and
    grinding the photovoltaic sputtering target in an inert environment to form a powder.

2. The method of claim 1, further comprising:
    washing the removed photovoltaic sputtering target with deionized water; and
    drying the removed photovoltaic sputtering target.

3. The method of claim 1, further comprising:
    removing any remaining indium from the photovoltaic sputtering target using hydrochloric acid.

4. The method of claim 1, further comprising:
    forming a new photovoltaic sputtering target from the powder.

5. The method of claim 4, wherein the new photovoltaic sputtering target is formed by pressing.

6. The method of claim 4, further comprising:
    combining the powder with additional photovoltaic compound.

7. The method of claim 4, further comprising:
    assessing the composition of the powder; and
    adding one or more individual elements to the powder to correct the composition of the new photovoltaic sputtering target.

8. The method of claim 1, wherein the photovoltaic compound is Cu(In,Ga)Se$_2$.

9. The method of claim 1, wherein the photovoltaic compound is Cu$_2$ZnSnSe$_4$, CuGaSe$_2$, or CuInSe$_2$.

10. The method of claim 1, wherein the photovoltaic sputtering target is a pressed target.

11. A method comprising:
    providing a sputtering target assembly comprising:
        a photovoltaic sputtering target comprising a photovoltaic compound;
        a backing plate;
        an indium layer bonding the photovoltaic sputtering target to the backing plate;
            wherein a surface of the photovoltaic sputtering target has a nonuniform wear pattern exposing a portion of the backing plate or the indium layer through a hole in the photovoltaic sputtering target;
    removing the photovoltaic sputtering target from the backing plate by melting the indium; and
    grinding the photovoltaic sputtering target in an inert environment to form a powder.

12. The method of claim 11, further comprising:
    removing any remaining indium from the photovoltaic sputtering target using hydrochloric acid.

13. The method of claim 11 further comprising:
    washing the removed photovoltaic sputtering target with deionized water; and
    drying the removed photovoltaic sputtering target.

14. The method of claim 11, further comprising:
    forming a new photovoltaic sputtering target from the powder.

15. The method of claim 14, wherein the new photovoltaic sputtering target is formed by pressing.

16. The method of claim 15, further comprising:
    combining the powder with additional photovoltaic compound.

17. The method of claim 15, further comprising:
    assessing the composition of the powder; and
    adding one or more individual elements to the powder to correct the composition of the new photovoltaic sputtering target.

18. The method of claim 11, wherein the photovoltaic compound is Cu(In,Ga)Se$_2$.

19. The method of claim 11, wherein the photovoltaic compound is Cu$_2$ZnSnSe$_4$, CuGaSe$_2$, or CuInSe$_2$.

20. The method of claim 11, wherein the photovoltaic sputtering target is a pressed target.

21. The method of claim 1, wherein the backing plate comprises copper.

22. The method of claim 11, wherein the backing plate comprises copper.

* * * * *